US011997805B2

(12) United States Patent
Delaporte (10) Patent No.: US 11,997,805 B2
(45) Date of Patent: May 28, 2024

(54) MACHINE LEARNING AND WIRELESS CONTROL OF A FLEXIBLE DISPLAY DEVICE ACTUATOR (71) Applicant: Lepton Computing LLC, Brooklyn, NY (US)

(72) Inventor: Stephen E. Delaporte, New York, NY (US)

(73) Assignee: LEPTON COMPUTING LLC., Brooklyn, NY (US)

( * ) Notice: Subject to any disclaimer, the term of this patent is extended or adjusted under 35 U.S.C. 154(b) by 0 days.

(21) Appl. No.: 17/725,460

(22) Filed: Apr. 20, 2022

(65) Prior Publication Data

US 2022/0338360 A1 Oct. 20, 2022

Related U.S. Application Data (60) Provisional application No. 63/177,365, filed on Apr. 20, 2021.

(51) Int. Cl.
*H05K 5/02* (2006.01)
*G06F 1/16* (2006.01)

(52) U.S. Cl.
CPC ......... *H05K 5/0217* (2013.01); *G06F 1/1652* (2013.01); *G06F 2203/04102* (2013.01)

(58) Field of Classification Search
CPC .. H05K 5/0217; H05K 5/0017; G06F 3/0346; G06F 3/041; G06F 2203/04102; G06F 3/011; G06F 1/1652; G06F 3/167; G06F 1/1624

See application file for complete search history.

(56) References Cited

U.S. PATENT DOCUMENTS

| 2004/0100511 | A1* | 5/2004 | Wong | G06F 1/1647 |
| | | | | 715/866 |
| 2004/0204059 | A1* | 10/2004 | Wong | H04M 1/0243 |
| | | | | 455/556.1 |
| 2014/0285476 | A1* | 9/2014 | Cho | H04M 1/0268 |
| | | | | 345/204 |
| 2020/0004297 | A1* | 1/2020 | Rekapalli | G06F 1/1618 |
| 2020/0170128 | A1* | 5/2020 | Kim | G06F 1/1681 |
| 2020/0267246 | A1* | 8/2020 | Song | H05K 1/148 |
| 2020/0301641 | A1* | 9/2020 | Park | G06F 3/1423 |

(Continued)

*Primary Examiner* — Sagar Shrestha
(74) *Attorney, Agent, or Firm* — Burns & Levinson, LLP; Joseph M. Maraia (57) ABSTRACT

Expandable touch screen display devices each having a flexible display that can be reconfigured from a compact state to an expanded state which also includes an actuator that can be controlled wirelessly and through machine learning algorithms. The form factor of the compact state for each device is roughly the size of a typical handheld phone or smaller. The form factor of the expanded state for each device is roughly the size of a larger phone or tablet computer. An internal actuator is provided for driving the motion of each device's change in size, whether through folding or sliding, or for other functions such as haptic feedback. The device may further include an integrated speaker and microphone, and sensors to indicate the expanded position of the display. In one embodiment, a module attached to, situated within, or otherwise associated with the device may contain all or substantially all processing and memory, along with a communications system.

13 Claims, 10 Drawing Sheets (56) References Cited

U.S. PATENT DOCUMENTS

| | | | |
|---|---|---|---|
| 2021/0096887 A1* | 4/2021 | Klein | G06F 3/0481 |
| 2021/0103314 A1* | 4/2021 | Ko | G06F 1/1624 |
| 2021/0116962 A1* | 4/2021 | Lee | G06F 1/1652 |
| 2021/0333831 A1* | 10/2021 | Saita | G06F 1/1641 |
| 2021/0405696 A1* | 12/2021 | Ahn | G06F 1/1624 |
| 2022/0061175 A1* | 2/2022 | Oh | H04M 1/0245 |
| 2023/0077374 A1* | 3/2023 | Yang | G06F 1/1652 |
| 2023/0085568 A1* | 3/2023 | Jin | H04M 1/0268 |
| | | | 455/575.1 |

\* cited by examiner

MACHINE LEARNING AND WIRELESS CONTROL OF A FLEXIBLE DISPLAY DEVICE ACTUATOR

CROSS REFERENCE TO RELATED APPLICATIONS

This application claims priority to and benefit of U.S. Provisional Patent Application No. 63/177,365, filed on Apr. 20, 2021, the entire contents of which are incorporated herein by reference for all purposes.

FIELD

The present disclosure relates generally to computing devices, and more particularly, to a computing device with a touch screen display that can be reconfigured from a compact state to multiple expanded states.

BACKGROUND

The use of handheld computing devices today has been significantly enabled by a number of advancements in electronics, including the miniaturization of components, an increase in processing speeds, improved memory capacity, and the optimization of battery efficiency. Advancements in touch screen display technology have also enabled interfaces to become more adaptable and intuitive to use on a small scale. Because of these enormous improvements over the last decade, the differences in the performance between handheld computing devices, such as mobile phones, and larger computing devices, have become increasingly subtle.

One of the great difficulties in using a small-scale touch screen device, however, is in the fact that it can often be cumbersome to physically interact with. This is especially apparent when selecting and manipulating features and inputting text, which can sometimes be imprecise for a user. In such handheld computing devices as a touch screen mobile phone, the limited size of the display can also significantly reduce the viewing capacity while watching videos, using graphic-intensive applications, and reading text. The rigid nature of a standard touch screen display can also limit the portability of a device when its form factor is in the larger size range for a phone, or at the scale of a tablet, which makes physical expansion a desirable feature. Additionally, because an expandable device can change in size through folding or sliding, an embedded actuator is desirable to autonomously assist with this physical transformation between states and to also enhance functionality of the device. Furthermore, the control of an embedded actuator through wireless means is desirable so that the motion of the device can be controlled from a remote location. The use of machine learning algorithms can also enhance the autonomous functions that can be driven by an embedded actuator.

There is therefore a need for touch screen display devices that can be expanded in size without sacrificing the convenience of being compact or handheld. There is also a need for an embedded actuator to generate the folding or sliding motion of the device, or other functions, which may be controlled through wireless means. This wirelessly controlled actuator from a first expandable device can also be controlled from a remotely located expandable device such that the folding or sliding action of the first expandable device is driven by the motion of the folding or sliding action of the remotely located expandable device through a sensor or an encoder. The remotely located device may also be a standard phone form factor, a smart watch, or any other device that can communicate wirelessly and may use a physical button, a touch screen interface, or another interface means such as an accelerometer to wirelessly control the change in motion of the first expandable device so that it can mimic the motion of the accelerometer within the remote device.

SUMMARY

Expandable touch screen display devices each having a flexible display that can be reconfigured from a compact state to an expanded state which also includes an actuator that can be controlled wirelessly are provided. The form factor of the compact state for each device is roughly the size of a typical handheld phone or smaller. The form factor of the expanded state for each device is roughly the size of a larger phone or tablet computer. An internal actuator is provided for driving the motion of each device's change in size, whether through folding or sliding, or for other functions such as haptic feedback. The device may further include an integrated speaker and microphone, and sensors to indicate the expanded position of the display. In one embodiment, a module attached to, situated within, or otherwise associated with the device may contain all or substantially all processing and memory, along with a communications system.

In embodiments, an apparatus of this disclosure includes a flexible touch-sensitive display composed of a first end and a second end. The first end is attached to and housed within a first structural support. The second end is attached to and housed within a second structural support. The flexible display wraps around a roller attached at the end of the second structural support. The flexible touch-sensitive display further has a fully retracted state. The flexible touch-sensitive display has a partially expanded state. The flexible touch-sensitive display further has a fully expanded state. The apparatus also includes a wireless module and an actuator attached to at least one structural support such that when the wireless module receives a wireless signal, the actuator can expand or retract the device. In further embodiments, the first structural support segment and the second structural support segment are mechanically engaged to slide parallel with each other. In embodiments, the motion of the device is tracked by an encoder.

In other embodiments, an apparatus of this disclosure includes a flexible touch-sensitive display composed of a first flexible touch-sensitive display portion and a second flexible touch-sensitive display portion. The first flexible touch-sensitive display portion is attached to a first structural support segment. The second flexible touch-sensitive display portion is attached to a second structural support segment. The flexible touch-sensitive display further has a fully folded state. The flexible touch-sensitive display further has a partially expanded state. The flexible touch-sensitive display further has a fully expanded state. The apparatus also includes a wireless module and an actuator attached to at least one structural support such that when the wireless module receives a wireless signal, the actuator can fold or unfold the device. In further embodiments, the first structural support segment and the second structural support segment are connected by a hinge and a sleeve structure that houses the hinge. In further embodiments, the motion of the device is tracked by an encoder.

BRIEF DESCRIPTION OF THE DRAWINGS

The subject matter regarded as the disclosure is particularly pointed out and distinctly claimed in the concluding portion of the specification. The disclosure, however, both as to organization and method of operation, together with objects, features, and advantages thereof, may best be understood by reference to the following detailed description when read with the accompanying drawings in which:

DETAILED DESCRIPTION

In the following detailed description, numerous specific details are set forth in order to provide a thorough understanding of the disclosure. However, it will be understood by those skilled in the art that the present disclosure may be practiced without these specific details. In other instances, well-known methods, procedures, and components have not been described in detail so as not to obscure the present disclosure.

Although embodiments of the disclosure are not limited in this regard, discussions utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulates and/or transforms data represented as physical (e.g., electronic) quantities within the computer's registers and/or memories into other data similarly represented as physical quantities within the computer's registers and/or memories or other information non-transitory storage medium that may store instructions to perform operations and/or processes. Although embodiments of the disclosure are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. Unless explicitly stated, the method embodiments described herein are not constrained to a particular order or sequence. Additionally, some of the described method embodiments or elements thereof can occur or be performed simultaneously, at the same point in time, or concurrently.

Figure 1:
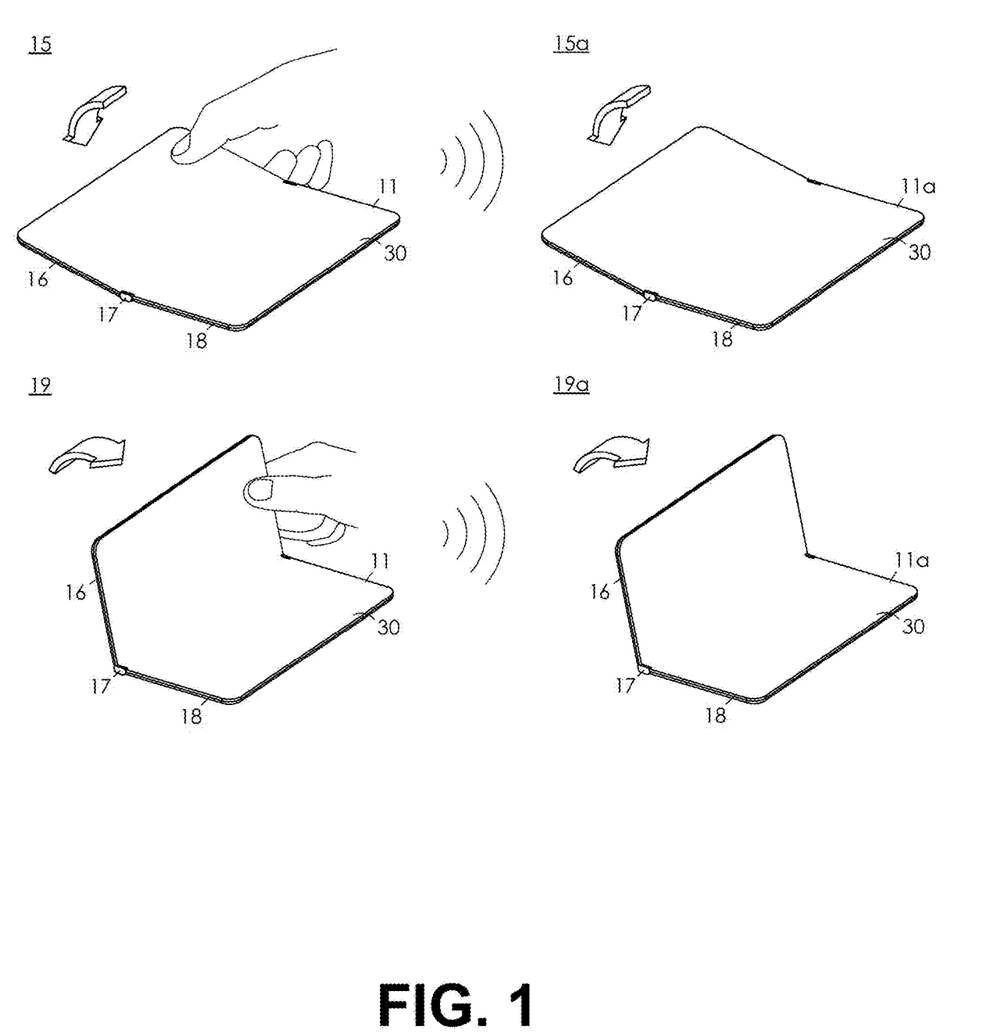
FIG. 1 is a perspective view of a first foldable mobile device with a flexible display being manually folded by a user to remotely control and translate the same motion to a second foldable mobile device, shown to the right side, through a wireless signal sent from the first foldable mobile device.

In accordance with the exemplary embodiment shown in FIG. 1, a foldable mobile device 11 is shown in the first illustration 15 with segment 16 of flexible display 30 being manually folded by a user about hinge 17 away from segment 18 towards an expanded position. As this motion is manually actuated by a user, an internal encoder, or any other kind of sensor that can detect a change in the position and direction of the folding motion, senses and records the motion by sending the data to a processing unit which then wirelessly sends the data through a transceiver module that may have Bluetooth or WiFi capacity to foldable mobile device 11a shown in the second illustration 15a. When the signal reaches foldable mobile device 11a through a transceiver module which is interfaced to the device's processor, the motion data is then sent to an actuator embedded inside foldable mobile device 11a such that it will autonomously actuate the same folding motion being recorded by foldable device 11. This feature is further shown in illustration 19 where mobile device 11 and segment 16 of flexible display 30 is being folded about hinge 17 but towards segment 18 such that the device is being folded in the direction of a closed position, which is the opposite direction shown from illustration 15. In illustration 19a, similar to illustration 15a, a user's manually actuated folding motion of foldable mobile device 11 from illustration 19 generates data which is then wirelessly sent to foldable mobile device 114a such that the translated motion can then be autonomously driven by an actuator embedded within foldable mobile device 19a to mimic the same folding motion recorded through foldable mobile device 19.

Figure 2:
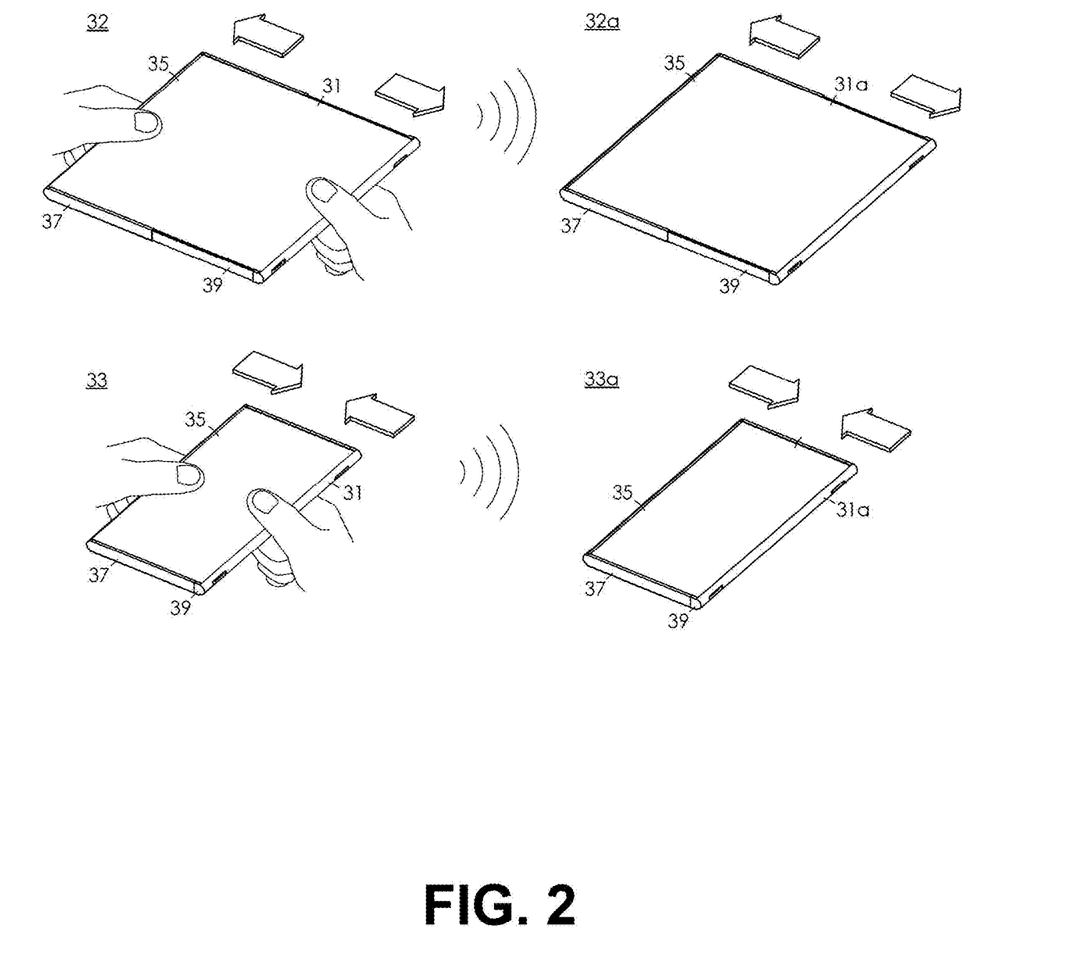
FIG. 2 is a perspective view of an expandable mobile device with a flexible display being manually expanded and then retracted by a user to remotely control and translate the same motion to a second expandable mobile device, shown to the right side, through a wireless signal sent from the first expandable mobile device.

FIG. 2 shows the same basic feature presented in FIG. 1, but with an expandable mobile device 31 where its flexible display 35 slides or rolls in and out of the housing of the device opposed to being folded. In the first illustration 32, expandable mobile device 31 is shown being expanded as a user pulls on the two shell structures 37 and 39 such that flexible display device 35 rolls out from shell structure 37. In illustration 32a, expandable mobile device 31a is shown autonomously mimicking the manually actuated expansion motion of expandable mobile device 31 after expandable mobile device 31 sends a signal to expandable mobile device 31a to control the motion of its actuator such that it expands in the same way that expandable mobile device 31 is in the first illustration 32. Similarly, in illustration 33, as the user pushes and retracts shell structures 37 and 39 of expandable mobile device 31 inward towards each other, expandable mobile device 31a, shown in illustration 33a, receives a signal from expandable mobile device 31a so that its actuator can then drive the retraction motion of the device to mimic the retraction motion of expandable mobile device 31a. Expandable mobile devices 31 and 31a may also use a standard processing unit and transceiver module that may have Bluetooth or WiFi capacity so that the device's can wirelessly communicate with each other, similar to the wireless configuration described for FIG. 1. It should be noted that the control of the motion from one device to another does not have to be in real time, for example, the motion could be communicated from the first device to the second device and then stored by the second device such that the motion sequence could then be activated at a later point in time based upon some trigger event. The motion control of the first device can also be indicated through a touch screen interface or through a physical button and is not limited to just a foldable or expandable flexible display device. An expandable device's motion may also be wirelessly communicated to a foldable device to actuate its motion and vice versa. The controlling device may also be any kind of electronic device that can transmit a wireless signal.

Figure 3:
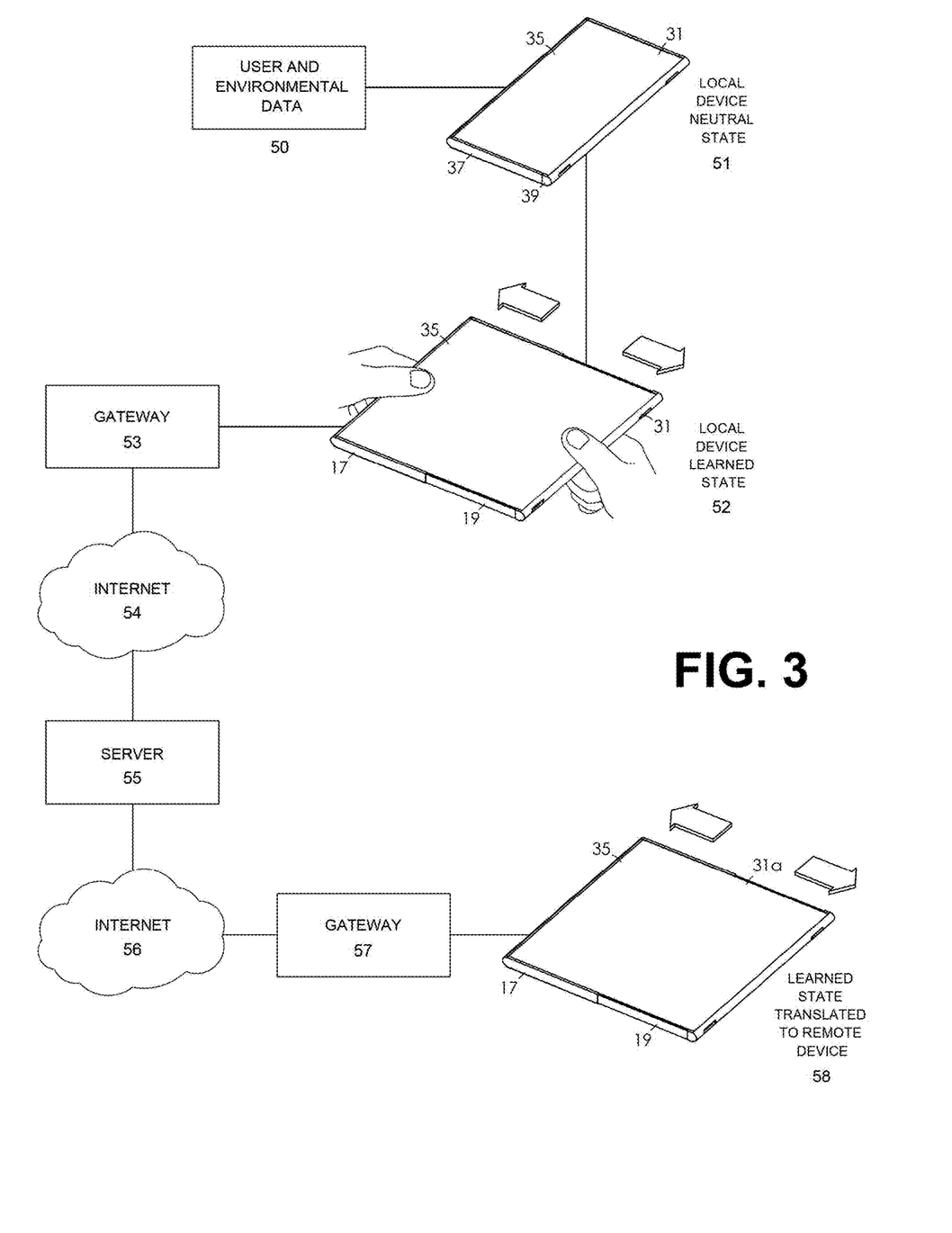
FIG. 3 is a flow diagram that corresponds with FIG. 2 showing how the manually actuated motion of the first expandable mobile device is wirelessly communicated and translated through the internet to a second expandable mobile device which then mimics the same motion.

The wireless communication between flexible display devices is further described in FIG. 3 through a flow diagram where expandable device 31, which is the local device of the diagram, is shown initially in a retracted and neutral state 51. The local expandable device 31 is then shown being manually expanded by a user, similar to how it is described being expanded in FIG. 2. Other user and environmental data 50 might also impact what the device senses to trigger a change in it physical state. From there, a gateway 53 is shown as the first device to receive a wireless signal from the expandable device 31. The gateway 53 can be any kind of local network device such as a router that may also have a firewall and it is the edge node of the network in which the data is first received. From there the data is sent through the internet 54 to a sever 55, which could be, but is not limited to, a web server or a file server, and the server can also be located locally or remotely. From there, the data is then sent back through the internet 56 to a gateway 57 again such that it can be sent to the remote device, in this case expandable device 31a, which can then receive the data through an embedded transceiver module. Similar to FIG. 2, expandable device 31a then, through an embedded actuator, learns and mimics the motion that was manually actuated from local expandable device 31. Another way to describe the end-to-end network communication between devices is as follows: 1) local device 31 is in neutral state; (2) local device enters learn state; (3) local device records data; (4) local device packages data; (5) local device transmits data to server. From the server perspective: (1) server receives local device data; (2) server authenticates local device; (3) server determines where to send data; (4) server sends data to destination. From the perspective of the remote device 31a: (1) remote device receives data from server; (2) remote device decodes data.

Figure 4:
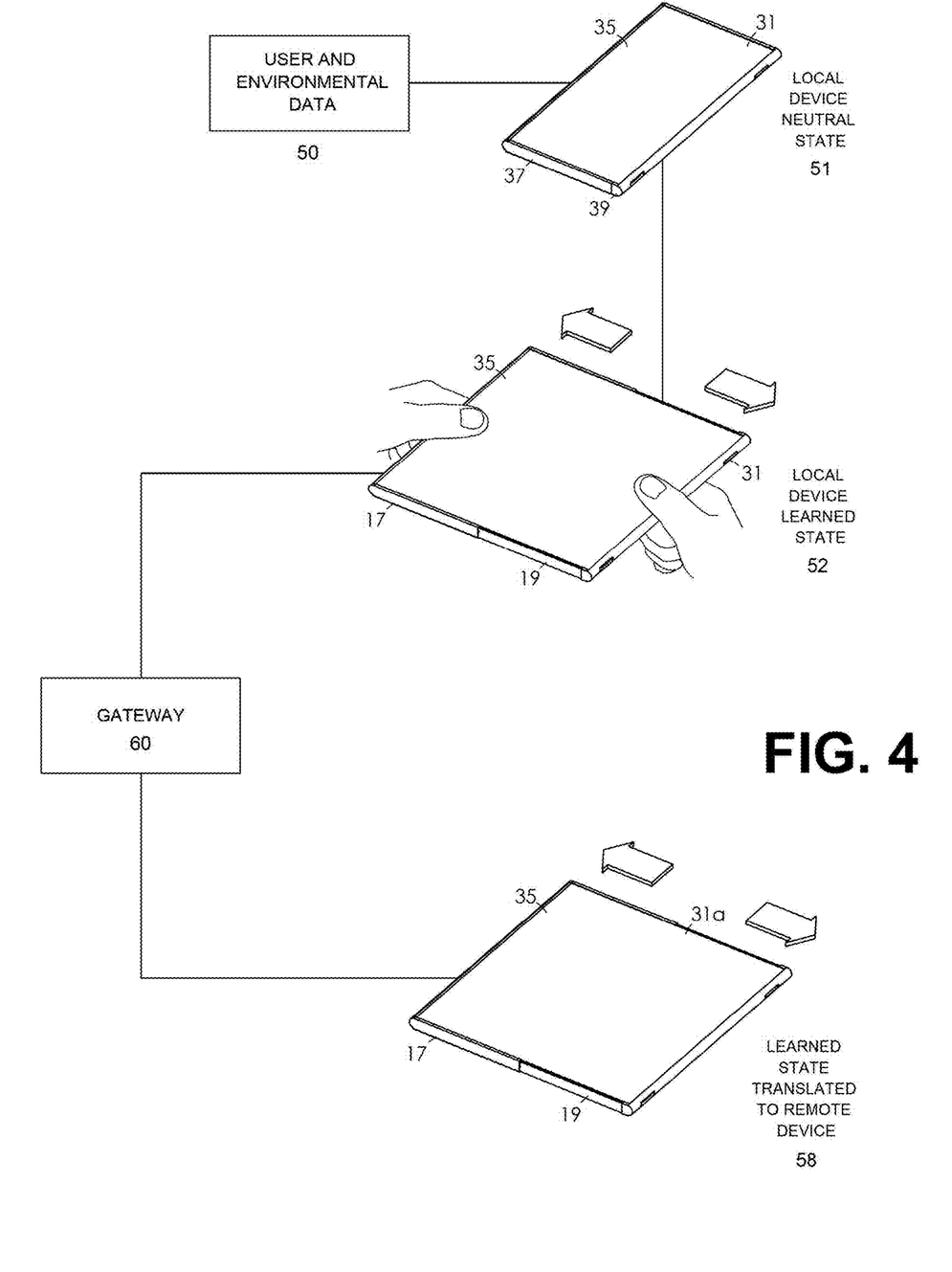
FIG. 4 is a flow diagram that corresponds with FIG. 3 showing how the manually actuated motion of the first expandable mobile device is wirelessly communicated and translated through a gateway to a second expandable mobile device which then mimics the same motion.

FIG. 4 is a flow diagram that corresponds with FIG. 3 showing how the manually actuated motion of local expandable mobile device 31 is wirelessly communicated and translated through a gateway 60 to a remote expandable mobile device which then mimics the same motion. In this case, the gateway could be represented by Bluetooth or some other local wireless connection means so that the devices can communicate with each other directly without the need for the internet or a server. It is important to emphasize that the user and environmental data 50 could teach the device to function based upon machine learning algorithms such that the device would react autonomously to an event. For example, if the device senses that two people are present in front of the camera when a photo is to be taken of them, the device might then expand through the motion generated by its embedded actuator to leverage the larger viewing capacity of the display so that both people can be seen on the display. If the device senses the rhythm of a song, it might begin to physically change its size by expanding and retracting to the rhythm of the music as an enhanced interaction or notification system, especially when the interaction is with a child who is learning new ideas. Another application might be for an AI that has a face which is presented on one of the segments of a foldable flexible display device such that when the AI speaks, the angle of the segment is indicative of the nodding of a head. If a user asks the AI a "yes" or "no" question, and the AI answers "yes", then the flexible display segment that the AI's face is shown on would move back and forth, similar to how a person would nod their head up and down when stating the word "yes" or if they are in agreement with something. These machine learning applications could be applied to expandable flexible display devices or foldable flexible display devices. Once the first device has learned some sequence, it may then be translated wirelessly to a second device such that the second device could mimic the sequence or behave based upon its own machine learning algorithms. The first or the second device can also function autonomous to each other when they are learning, and their respective motors are driving entirely different motions of the devices to the same or different user and environmental data 50. This machine learning can also occur independent of the wireless communication between device features.

Figure 5:
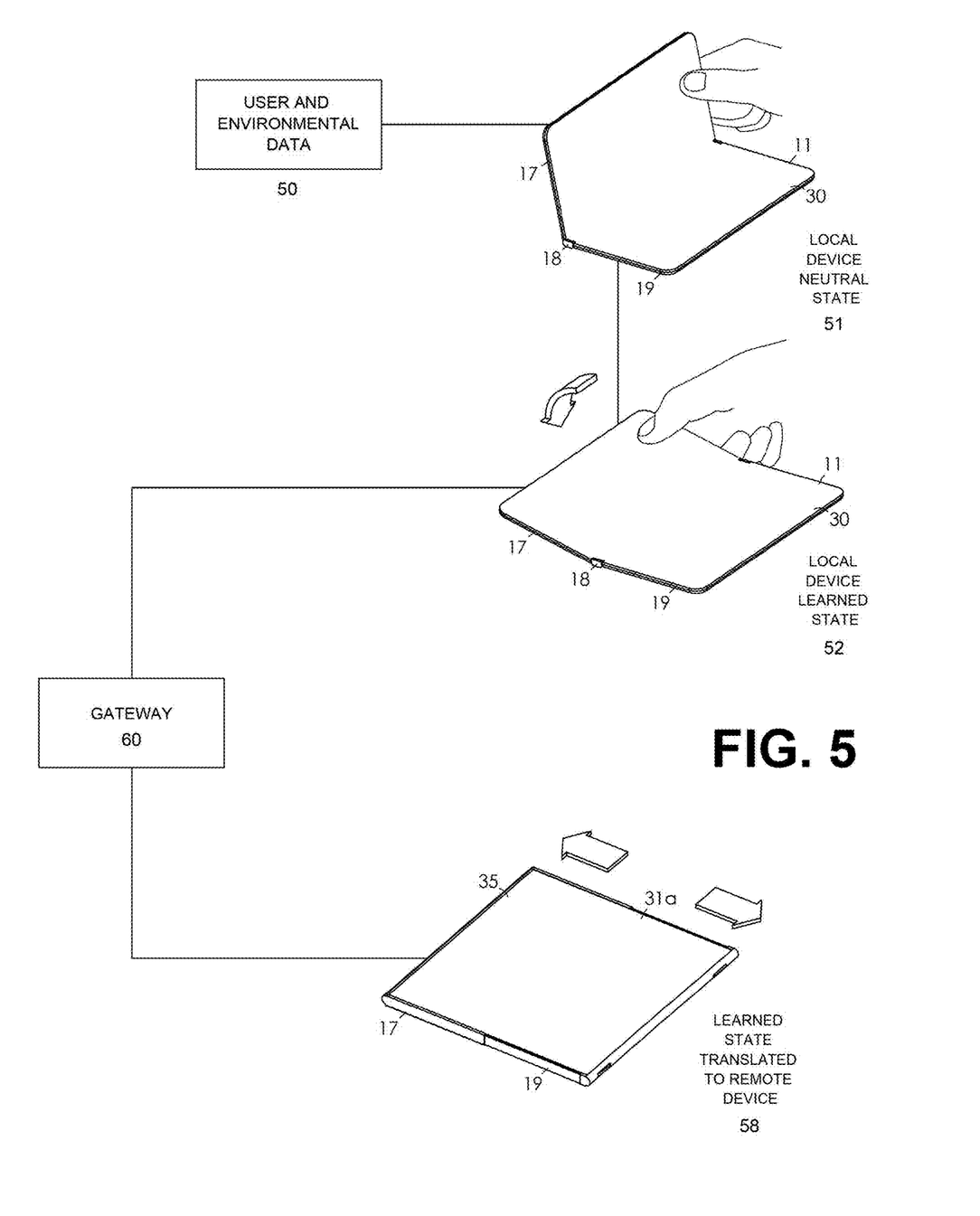
FIG. 5 is a flow diagram showing how the manually actuated motion of a foldable mobile device is wirelessly communicated and translated through a gateway to an expandable mobile device which then mimics the same motion displacement.

In accordance with FIG. 5, the same flow diagram that is shown in FIG. 4 is presented, but in this case, the local device is instead foldable device 30 which is wirelessly communicating a manually actuated motion sequence, the learned state 52, through gateway 60, which then communicates to a remote expandable device 31a the motion sequence which can then be actuated through its motor autonomously. Because the local flexible display device and the remote flexible display device have different form factors, the displacement of motion from foldable device 30 may be equivalent to the displacement of motion for expandable device 31a. These parameters can further be changed through the software on each device. The internet and a server may also be used instead of just a gateway for communication between different flexible display device form factors, similar to what it shown in FIG. 3.

Figure 6:
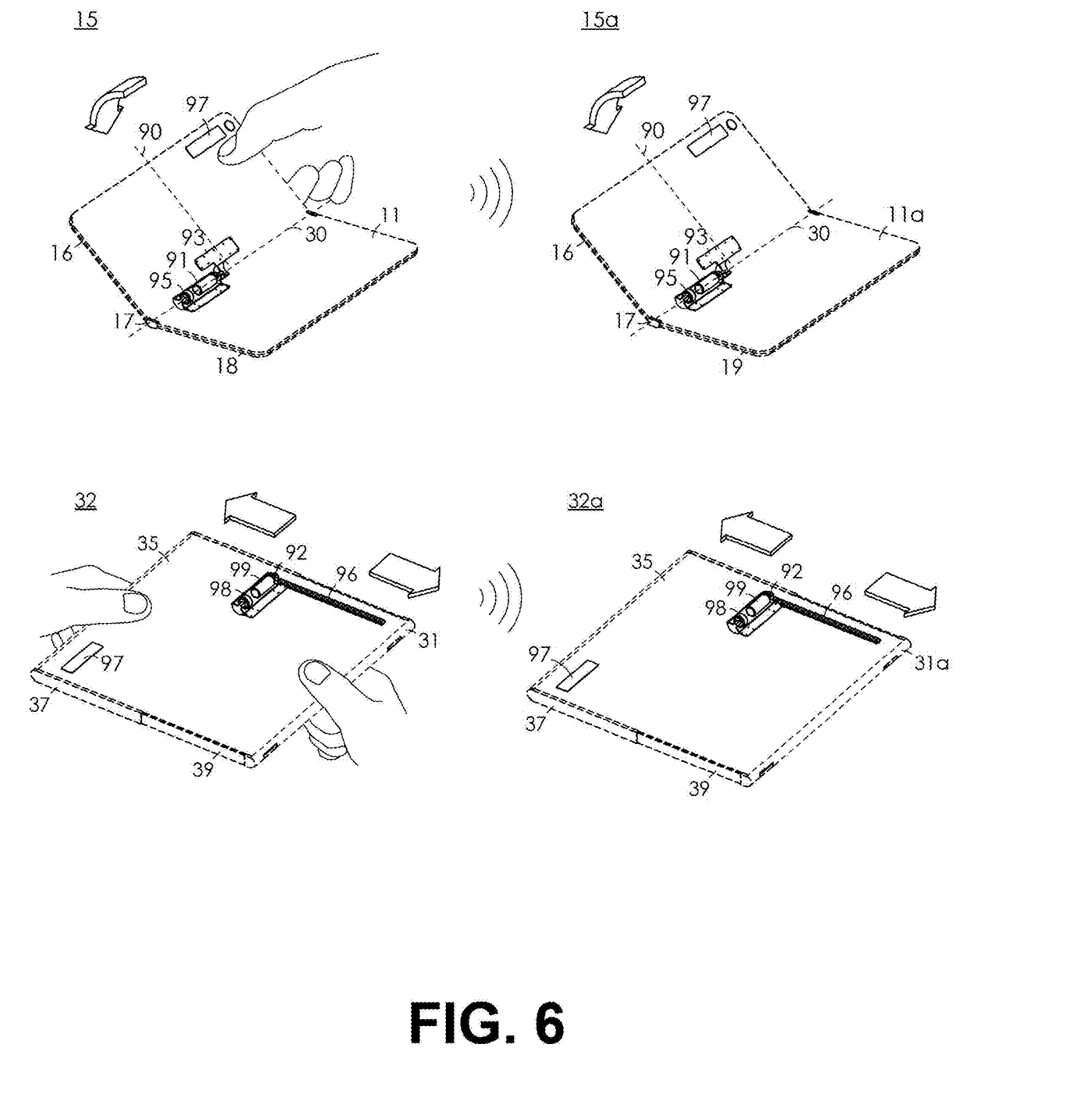
FIG. 6 is a perspective view of a first foldable mobile device on the top, and a first expandable mobile device on the bottom along with the second device to the right for each type of device with the motion of the first device being wirelessly translated to the second device while also highlighting the internal components for each device.

FIG. 6 shows a perspective view that corresponds with foldable display mobile devices 11 and 11a, which are shown in illustrations 15 and 15a from FIG. 1, and expandable display devices 31 and 31a, which are shown in illustrations 32 and 32a from FIG. 2. In these diagrams, the same concept is also highlighted as in FIG. 1 and FIG. 2, where the motion of the first device is being wirelessly translated to the second device, but in this case, it is also highlighting the internal components for each device. This includes the actuator 91 shown embedded within foldable mobile devices 11 and 11a, which can rotate drive plate 93 and the structural support segment 16 oriented along axis 90 that drive plate 93 is attached to. As structural support segments 16 or 18 are rotated about hinge 17 oriented along axis 30 either through the autonomous function of actuator 91, or through the manual force of a user's hands, an encoder 95 tracks the exact motion of the device. In this case foldable mobile device 11 is being folded manually, such that the motion recorded by encoder 95 is sent to a processor within the device so that the data can then be wirelessly transmitted through wireless module 97 from foldable mobile device 11. From there, the wireless module 97 in foldable mobile device 11*a* then receives the data and directly translates the same motion sequence recorded by foldable display device 11 so that its embedded actuator 91 can perform this same motion sequence. Similarly, with expandable mobile device's 31 and 31*a*, the manual sliding motion of expandable display device 31 through a user's hands rotates encoder 98, which is driven by the sliding motion of rack 96 as it rotates pinion gear 92, which then in turn rotates encoder 98. From there, an embedded processor within the device collects the encoder data and transmits that data wirelessly through the wireless module 97 within expandable display device 31 so that it can then be received by the wireless module 97 embedded within expandable display device 31*a*. From there the motion driven by a user's hands with expandable display device 31 can then be seen translated to the expansion and retraction of expandable display device 31*a*, which is driven by its embedded actuator 99 that works in conjunction with its encoder 98 to drive pinion gear 92 and rack 96. As rack 96 moves back and forth, it ultimately expands and retracts the flexible display 35 of expandable display device 31*a* It is important to note that other kinds of drive mechanisms can be used beyond a rack and pinion gear.

Figure 7:
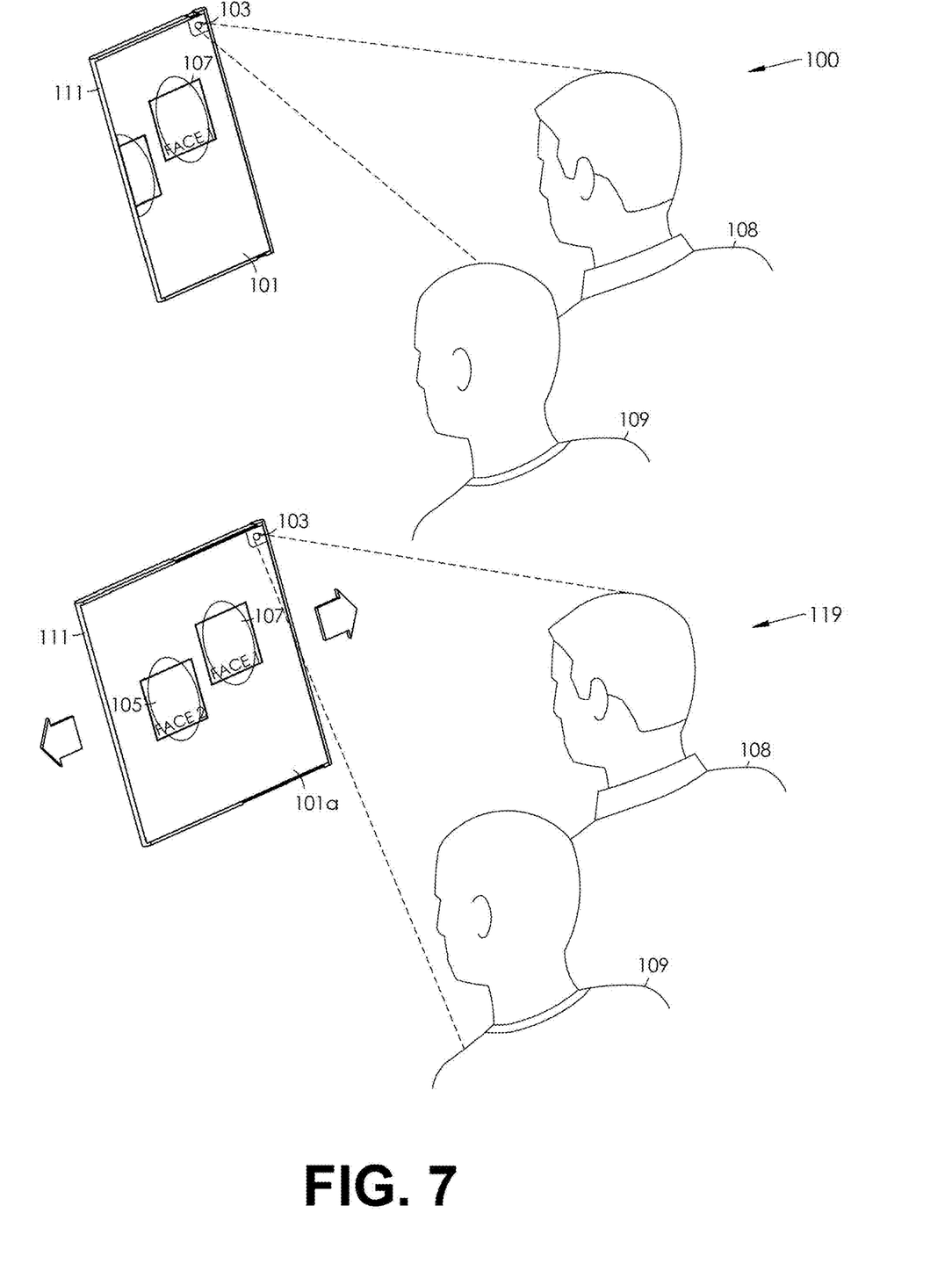
FIG. 7 is a perspective view of a first state for an expandable display mobile device using machine learning for facial recognition, and then below it, a second state of the device where it has self-adjusted to an expanded state to show each face recognized by the device on the display.

In FIG. 7, a perspective view is shown of a first state for an expandable display mobile device 111 where machine learning algorithms are utilized to implement facial recognition. In illustration 100, two people 108 and 109 are situated in front of expandable display device 111, where its camera 103 captures the image of people 108 and 109. Facial recognition is then implemented to recognize the two faces on flexible display 101. Because expandable display device 111 is in a retracted state in illustration 100, which can only show face 1 107, the second state of expandable display device 111 from illustration 133 then self-adjusts to an expanded state to show both face 1 107 and face 2 105 which correspond to person 108 and person 109 respectively on expanded flexible display 101*a* so that the full scope of the image being captured can be better seen by the users. This is especially useful if the device is capturing photos or video from a distance where the user or users are not able to hold the device with their hands.

Figure 8:
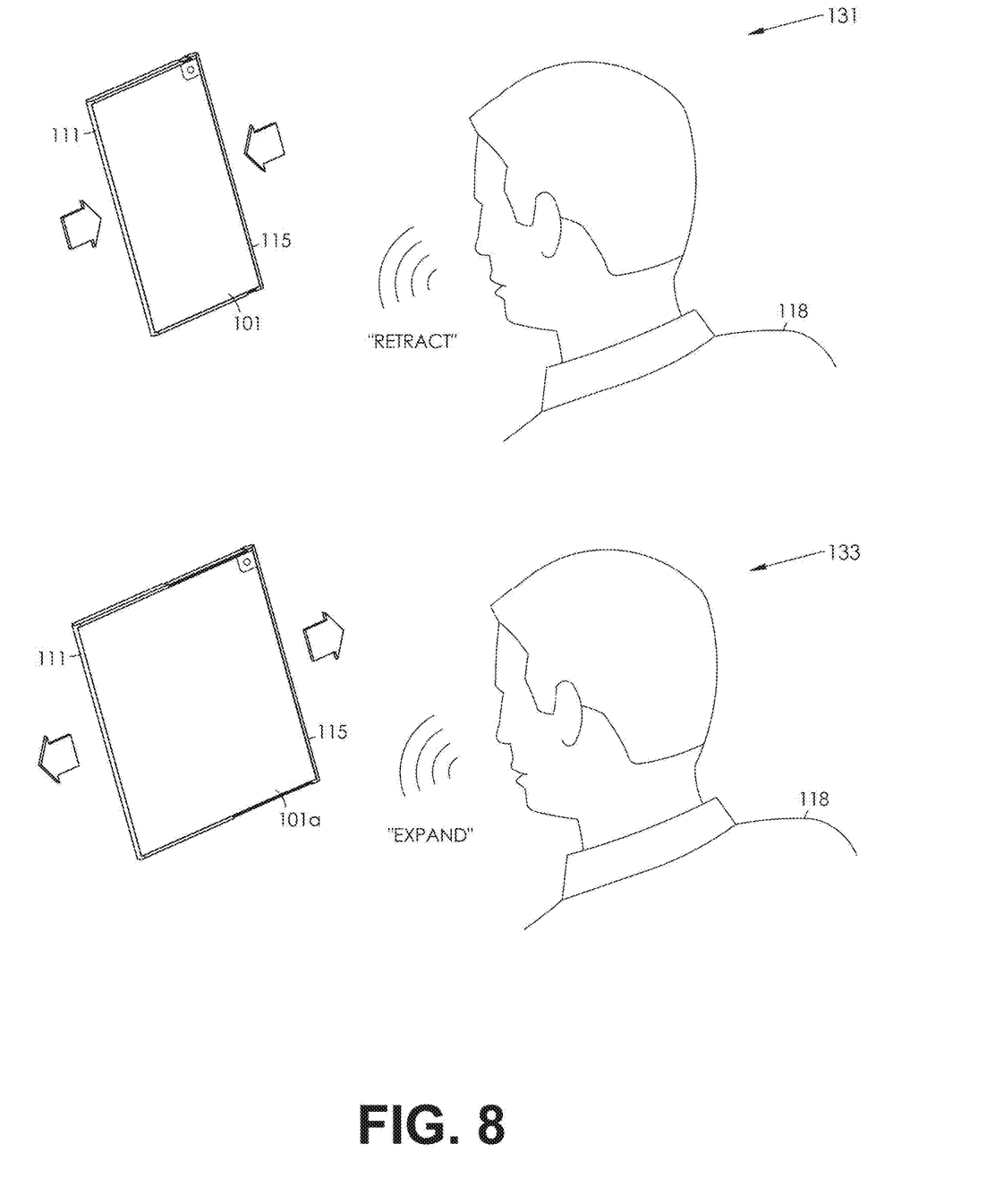
FIG. 8 is a perspective view of a retracted state for an expandable display mobile device driven by a verbal command using machine learning for voice recognition, and then below, the device is shown in an expanded state to highlight how the device then responds to another verbal command also through voice recognition.

FIG. 8 shows a perspective view of a retracted state for an expandable display mobile device 111 which is driven by a verbal command spoken by person 118 that is picked up by microphone 115 using machine learning algorithms to implement voice recognition. In this case person 118 says the word "retract" and the device responds by retracting. This word can also be programmed using another word and the device could learn even multiple words that would trigger the retraction or partial retraction of the device. In the second illustration 133 shown below, expandable display device 111 is shown in an expanded state with expanded flexible display 101*a* shown to highlight how the device then responds to another verbal command through voice recognition. In this case, person 108 says "expand" and the device then picks up the sound through microphone 115 and as a result reconfigures to an expanded state. This verbal command can also be interchangeable with other words.

Figure 9:
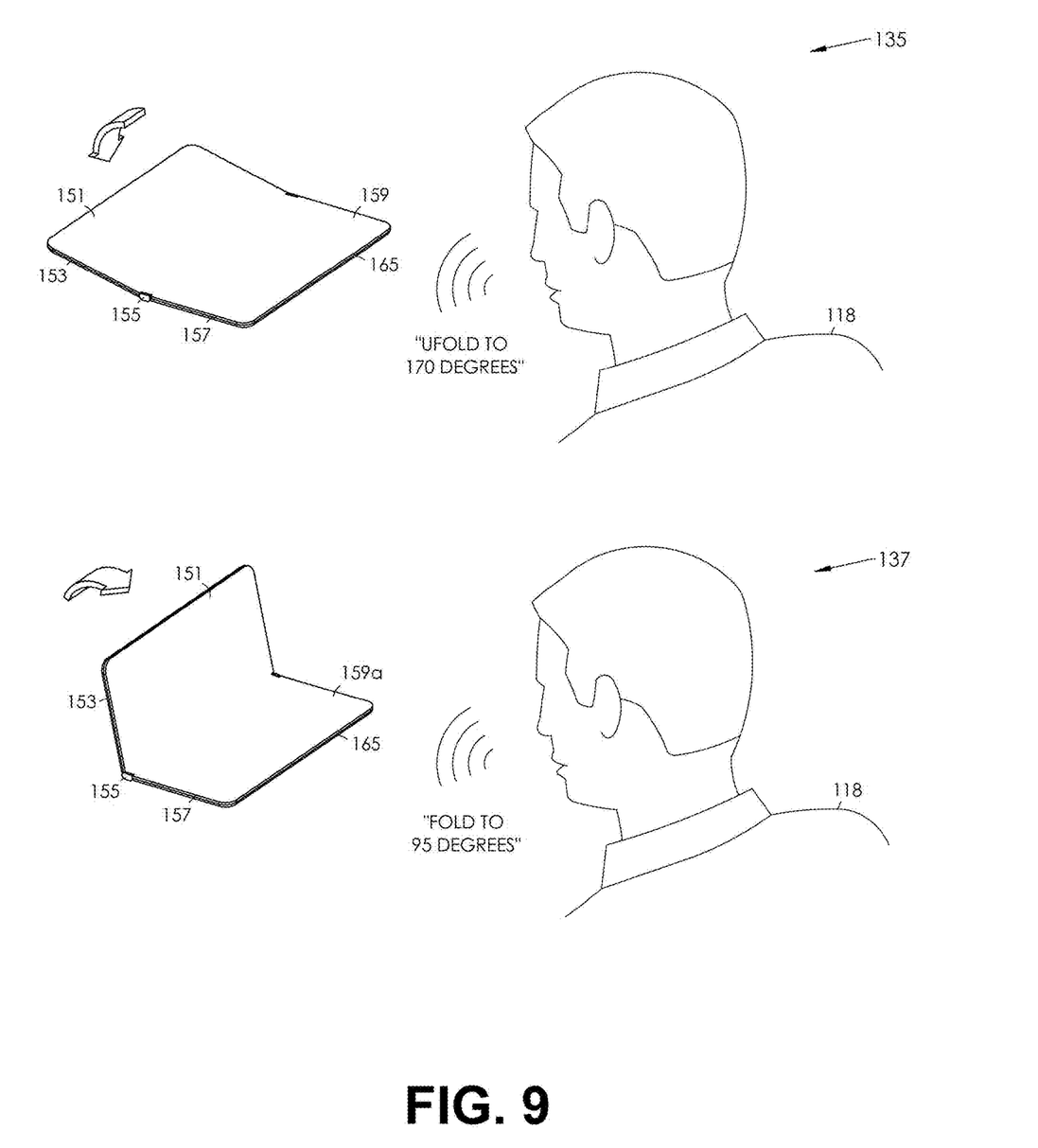
FIG. 9 is a perspective view of a first folded state for a foldable display mobile device driven by a verbal command using machine learning for voice recognition, and then below, the device is shown in a second folded state to highlight how the device then responds to another verbal command also through voice recognition.

Similar to FIG. 8, FIG. 9 is a perspective view showing a voice recognition function, but with a foldable display mobile device 151 driven by a verbal command using machine learning algorithms to process the words of person 118. In this case, the user states "unfold to 170 degrees", which is picked up by microphone 165 and then processed by the device to unfold to that exact position by moving structural support segments 153 and 157 about hinge 155 such that flexible display 159 is configured into that angle. Then below in illustration 137, foldable display device 151 device is shown in a second folded state to highlight how the device then responds to another verbal command also through voice recognition implemented through machine learning algorithms that can process the verbal command "fold to 95 degrees" which is spoken by person 118. Foldable mobile device 151 and its folded flexible display device 159*a* and structural support segments 153 and 157 then folds into that position.

Figure 10:
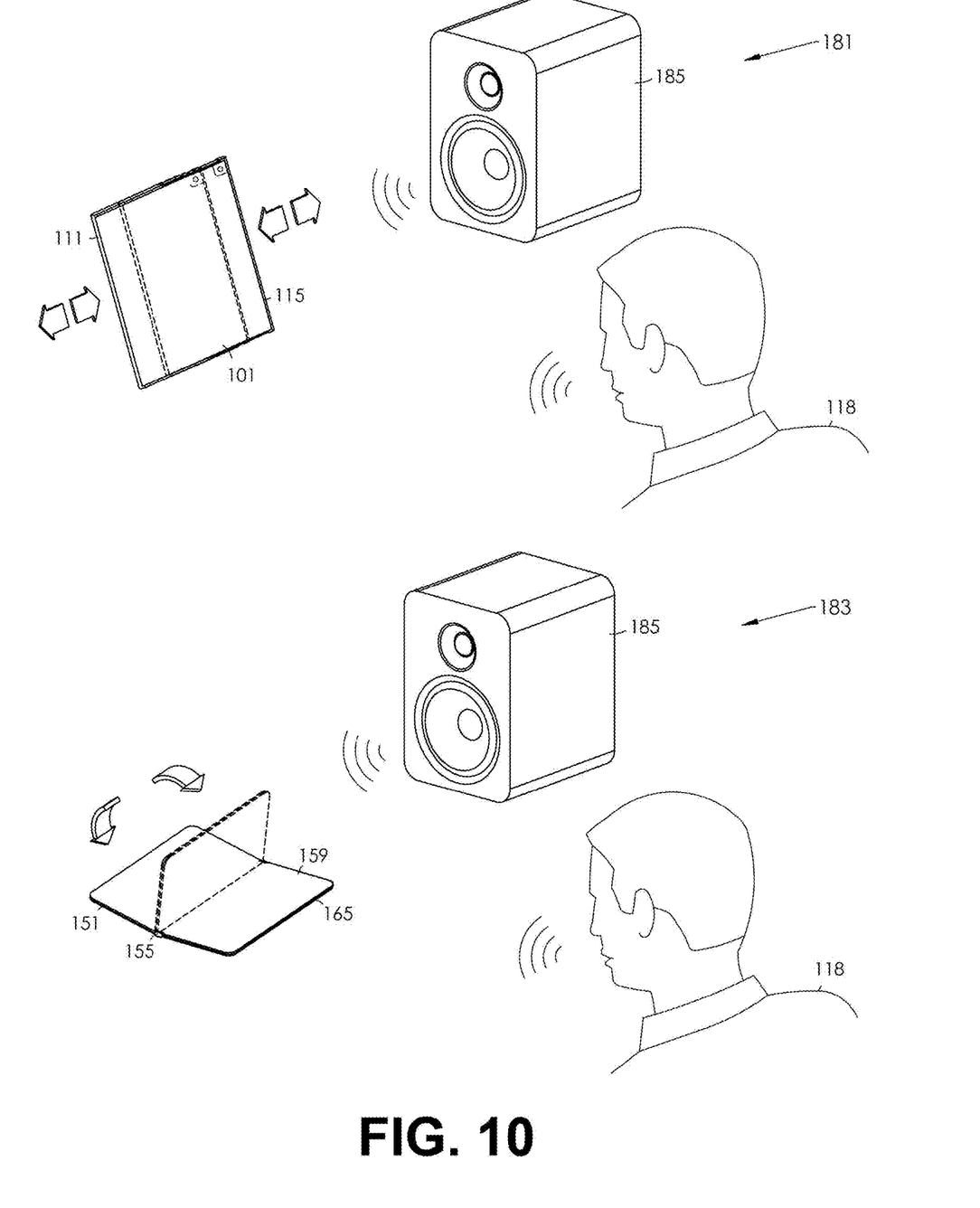
FIG. 10 is a perspective view of an expandable display mobile device shown dynamically expanding and retracting which is driven by the sounds of a speaker or a person, and then below, a foldable display mobile device dynamically folding and unfolding which is also driven by the sounds of a speaker or a person.

In FIG. 10 an expandable display mobile device 11 is shown dynamically expanding and retracting its flexible display 101 in illustration 181 as a result of the music or sounds generated from speaker 185 or the sounds or words spoken by person 118, or other sounds from the environment around the device. The device in this case expands and contracts with the same rhythms of the music or sounds that its speaker 115 is picking up. This function might enhance interaction with the device for someone who has difficulty seeing, or for other applications such as with education or gaming, or just haptic functions in general and so on. A foldable display mobile device 151 is similarly shown with the same function in illustration 183 as it is dynamically folding and unfolding with a rhythm based upon the sounds picked up by microphone 165 which are generated from either speaker 185 or a person 118 or both, or other sounds from the environment around the device.

It should be noted that the actuator described for each embodiment is not limited to just a motor with a rotational output but could also be a linear actuator such as a solenoid or other kinds of actuators that are small enough to fit within the device's housing. It should also be noted that the actuator being implemented within the flexible display device could be used for other applications such as providing haptic feedback for the folding or expansion mechanics, whereby the physical force that a user is applying to a first device can wirelessly signal to the second device to actuate more counterforce when the second device is being folded and unfolded, or retracted and expanded. These interactions and the parameters for motion and feedback defined between devices may also be configured in different ways depending on the application that they are being used for. In another application haptics can be used to provide a protrusion or multiple protrusions from underneath the display where the actuator can vary the physical displacement of the flexible display at different points, especially if there is an array of actuators. In this case, if a user with one flexible display device is pushing on the surface, this may in turn wirelessly translate a signal to a second flexible display device that then reacts by activating an actuator to force the display to protrude in the same location where the flexible display on the first device is being touched. The intensity of force applied to the display of the first device might also increase the intensity of the protrusion on the second device. Applications for this kind of feature could be used to enhance gaming interfaces, physical therapy applications, applications for the blind, or for enhancing video conferencing where the physical presence of a person's fingers can be felt as a physical simulation on the flexible display where the user is viewing the video of the person that they are video conferencing with.

While certain features of the disclosure have been illustrated and described herein, many modifications, substitutions, changes, and equivalents will now occur to those of ordinary skill in the art. It is, therefore, to be understood that the appended claims are intended to cover all such modifications and changes that fall within the true spirit of the disclosure.

What is claimed is:

1. An apparatus comprising:
   (a) a flexible touch-sensitive display composed of a first flexible touch-sensitive display portion and a second flexible touch-sensitive display portion; wherein:
      (1) the first flexible touch-sensitive display portion is attached to a first structural support segment;
      (2) the second flexible touch-sensitive display portion is attached to a second structural support segment;
      (3) the flexible touch-sensitive display further includes a fully folded state;
      (4) the flexible touch-sensitive display further includes a partially folded state;
      (5) the flexible touch-sensitive display further includes a fully expanded unfolded state; and
   (b) a sensor integrated to detect and generate data from the folding motion and position of the first structural support segment in relation to the second structural support segment; and
   (c) an actuator attached to at least one structural support segment such that when an artificial intelligence algorithm is run on the apparatus the actuator can fold or unfold the apparatus based upon user inputs processed by the artificial intelligence algorithm.

2. The apparatus of claim 1, wherein:
the first structural support segment and the second structural support segment are connected by a hinge and a sleeve structure, whereby the sleeve structure houses the hinge and the actuator.

3. The apparatus of claim 1 wherein:
the sensor to detect and generate data from the folding motion and position of the apparatus is an encoder.

4. The apparatus of claim 1 wherein:
the sensor to detect and generate data from the folding motion and position of the apparatus is an accelerometer.

5. The apparatus of claim 1 wherein:
the artificial intelligence algorithm utilizes machine learning.

6. The apparatus of claim 1 wherein:
the user inputs processed by the artificial intelligence algorithm include folding motions detected by the sensor.

7. The apparatus of claim 1 wherein:
the user inputs processed by the artificial intelligence algorithm include audio signals.

8. The apparatus of claim 1 wherein:
the user inputs processed by the artificial intelligence algorithm include visually captured items.

9. The apparatus of claim 1 wherein:
the user inputs processed by the artificial intelligence algorithm include touch screen interactions.

10. The apparatus of claim 1 wherein:
the artificial intelligence algorithm utilizes facial recognition.

11. The apparatus of claim 10 wherein:
the actuator adjusts the folded angle of the apparatus based upon facial recognition inputs such that at least one face can be seen on one portion of the apparatus.

12. The apparatus of claim 1 wherein:
the artificial intelligence algorithm utilizes voice recognition.

13. The apparatus of claim 1 wherein:
the fully folded state comprises a fully folded angle between the first flexible touch-sensitive display portion and the second flexible touch-sensitive display portion that is less than 10 degrees; and
the fully unfolded state comprises a fully unfolded angle between the first flexible touch-sensitive display portion and the second flexible touch-sensitive display portion that is between 170 and 190 degrees; and
the partially folded state comprises an angle that falls between the fully folded state and the fully unfolded state.

* * * * *